US000001915H

United States Statutory Invention Registration [19]

[11] Reg. Number: H1,915

Boone et al.

[45] Published: Nov. 7, 2000

[54] HYBRID STATIC RAM CIRCUIT

[75] Inventors: John V. Boone, Burnsville; John R. Ukura, Lino Lakes, both of Minn.

[73] Assignee: Cardiac Pacemakers, Inc.

[21] Appl. No.: 09/216,162

[22] Filed: Dec. 18, 1998

[51] Int. Cl.[7] ..... G11C 7/00

[52] U.S. Cl. ..... 365/200; 371/40.13; 371/37.3

[58] Field of Search ..... 365/230.03, 52, 365/200, 201; 371/40.11, 40.13, 37.3

[56] References Cited

U.S. PATENT DOCUMENTS

| | | | |
|---|---|---|---|
| 4,506,365 | 3/1985 | Collins | 371/38 |
| 4,547,882 | 10/1985 | Tanner | 371/38 |
| 4,965,828 | 10/1990 | Ergott, Jr. et al. | 380/50 |
| 5,056,095 | 10/1991 | Horiguchi et al. | 371/40.1 |
| 5,566,194 | 10/1996 | Wells et al. | 371/51.1 |
| 5,671,388 | 9/1997 | Hasbun | 395/430 |

*Primary Examiner*—Daniel T. Pihulic

*Attorney, Agent, or Firm*—Schwegman, Lundberg, Woessner & Kluth, P.A.

[57] ABSTRACT

A hybrid memory provides both protected and unprotected storage arrays within a common device. The memory includes shared resources including address decoding, data input and output paths and power supply. Three memory arrays provide the storage capacity in which a first memory serves as unprotected memory and a second and third provide storage for data and error correction codes, respectively.

1 Claim, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HYBRID STATIC RAM CIRCUIT

FIELD OF THE INVENTION

The present subject matter relates generally to static RAM and in particular, to tripartite hybrid static RAM having protected storage and unprotected storage.

BACKGROUND OF THE ART

Computer memory provides the storage facilities for programming and data. Computer memory comprises many memory cells arranged in arrays of rows and columns. Random access memory is one variant of computer memory that allows reading and writing of individual cells within an array.

Historically, the development of memory has been motivated by several well-recognized parameters. As with most electronic technology, miniaturization, improved performance and lower costs are critical forces behind the development of new memories.

Computer memory is often used in data transmission systems. With the reduction in the physical size of memories, errors in stored data can result from atomic events in the atmosphere. For some applications, it is advantageous to include provisions to detect and, in some cases, correct memory errors.

Traditional methods of providing error correction and detection have required the addition of separate computer memory. Providing separate memory requires its own associated power supply, data input and output lines, addressing and decode logic. Where additional memory dedicated to error correction is provided, the objectives of miniaturization, improved performance and lower costs are often frustrated.

SUMMARY

In one embodiment, hybrid static random access memory ("SRAM") may include both unprotected and protected data storage in a common package having shared resources. The unprotected data storage includes 8 k of eight-bit data storage array ("first memory array"). Protected data storage includes 16 k of eight-bit data storage array ("second memory array") and 16 k of four-bit Hamming code data storage array ("third memory array"). A first write enable connection is coupled to both the first memory array and the second memory array. A second write enable connection is coupled to the third memory array. Address translation circuitry and decode logic is coupled to the first, second, and third memory arrays. The first and second memory arrays are connected to 8-bits of data input and 8-bits of data output. The third memory array is connected to 4-bits of data input and 4-bits of data output. Error correction codes, herein implemented in a form known as Hamming code, are generated external to the device and stored in the third memory array. The Hamming code varies with data stored in the second memory array. The SRAM allows both data and Hamming code to be stored and read in a single clock cycle.

In this configuration of shared resources, the data storage location is determined by the address translation circuitry and decode logic. Advantageously, the present SRAM has the physical appearance of a single SRAM device and yet, functionally, operates as two separate devices. Because one embodiment incorporates shared resources, many expenses normally associated with the design, development and testing stages of memory are avoided.

DETAILED DESCRIPTION

Figure 1:
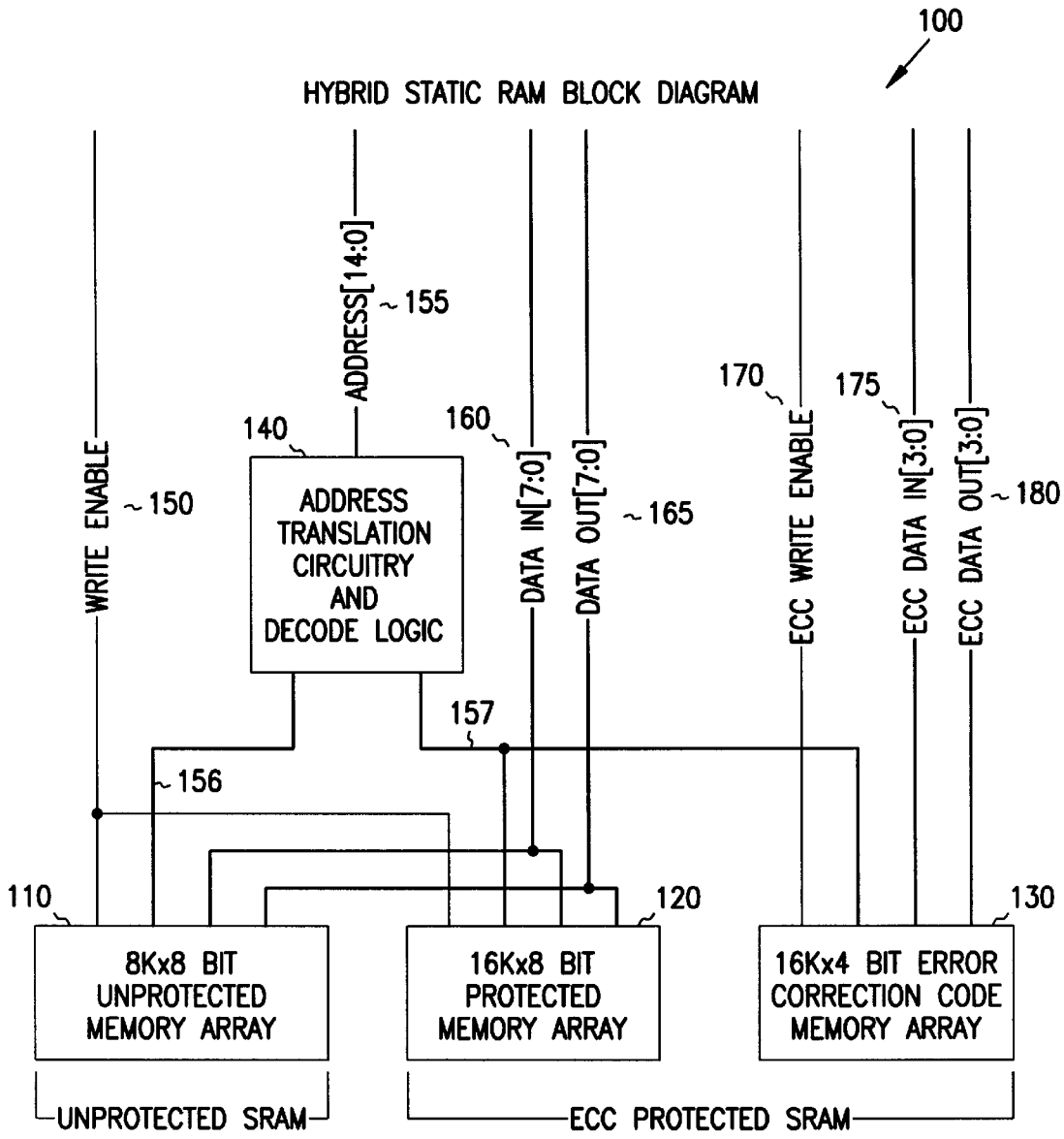
FIG. 1 is a block diagram of memory implementing one embodiment.

In the following detailed description, reference is made to the accompanying drawings that form a part hereof. In the drawings, like numerals describe substantially similar components throughout the several views.

System Overview

FIG. 1 is a block diagram of one embodiment of the present subject matter. System 100 includes coupling of address translation circuitry and decode logic ("address decoder") 140, unprotected memory array with storage capacity of 8 k by 8-bits ("first memory array") 110, protected memory array with storage capacity of 16 k by 8-bits ("second memory array") 120, and error correction code memory array with storage capacity of 16 k by 4-bits ("third memory array") 130. First memory array 110 provides unprotected storage and together, the second memory array 120 and third memory array 130, provide protected storage. In one embodiment, system 100 provides memory storage addressed over a range of 24 k. In one sense, the capacity may be construed as 32 K of total memory storage, or perhaps more accurately, as 256 k bits of data partitioned into a number of different word sizes. Protected and unprotected storage is described subsequently.

Electrically, system 100 appears as a single SRAM device, yet functionally, system 100 operates as two separate SRAMs. The dual nature of system 100 delineates the protected storage from the unprotected storage. This configuration allows storage of either 8-bits of data or 8-bits of data having 4-bits of error correction.

FIG. 1 also depicts the coupling among address decoder 140, first memory array 110, second memory array 120, and third memory array 130. Address decoder 140 receives addressing information on the address bus 155. In addition to the coupling of the address bus 155 to address decoder 140, address bus 155 may also be coupled to an external processor (not shown). Address bus 155 comprises 15 conductors in which each conductor communicates digital address information.

Address decoder 140 provides addressing information to the first memory array 110, second memory array 120 and third memory array 130. First address line 156 couples the address decoder 140 to first memory array 110. Second address line 157 couples the address decoder 140 to both second memory array 120 and third memory array 130.

Address translation circuitry, within the address decoder 140, determines which functional SRAM (protected or unprotected storage) is to be accessed. More specifically, address translation circuitry changes address mapping so that sub-array decoders (not shown discretely but incorporated within address decoder 140) can route data to the appropriate memory storage location. Address decode logic controls the shared resources of the circuit and manages contention between the functional SRAMs. In other words, address decoder 140 controls the location of data storage within the system 100. One embodiment employs sub-array select decoders (within address decoder 140).

First write enable 150 is a single digital conductor line coupled to both first memory array 110 and second memory array 120. First write enable 150 is also coupled to external devices not shown in FIG. 1.

First data input bus 160 receives data from external devices not shown in FIG. 1 and couples to both first memory array 110 and second memory array 120. First data input bus 160 comprises 8 conductors in which each conductor communicates digital data information. Similarly, first data output bus 165 receives data from both first memory array 110 and second memory array 120 and couples to external devices not shown in FIG. 1. First data output bus 165 also comprises 8 conductors in which each conductor communicates digital data information.

Second write enable 170 is a single digital conductor line coupled to third memory array 130. Second write enable 170 is also coupled to external devices not shown in FIG. 1.

Second data input bus 175 receives data from external devices not shown in FIG. 1 and couples to third memory array 130. Second data input bus 175 comprises four conductors in which each conductor communicates digital data information. Similarly, second data output bus 180 receives data from third memory array 130 and couples to external devices not shown in FIG. 1. Second data output bus 180 also comprises four conductors in which each conductor communicates digital data information.

One embodiment of system 100 provides three discrete storage areas. First memory array 110 provides unprotected storage whereas the combination of second memory array 120 and third memory array 130 provide protected storage. In this context, protected storage means a data storage having associated error correction storage. A detailed description of error correction appears in a subsequent section of this application.

The address decoder 140 provides a memory mapping function by which data on the data input bus 160 is alternatively stored in either the unprotected storage area or protected storage area. Where protected storage is selected by the address decoder 140 and second write enable 170 is activated, the corresponding error correction data (generated external to system 100) is stored in the third memory array 130.

Error Correction and the Hamming Code

Third memory array 130 provides error correction code storage. The error correction code includes redundant, error correction and detection data for the protected data. In one embodiment, the error correction code implemented is a four-bit Hamming code. Hamming code can detect two-bit errors and correct single-bit errors. Error correction codes stored in the third memory array 130 corresponds to data stored in the second memory array 120. The Hamming code in the third memory array 130 provides the protection for data stored in the second memory array 120. Because the first memory array 110 is not associated with a discrete error correction code storage area, first memory array 110 is denoted as unprotected storage.

Because the address space occupied by the Hamming code is the same as the protected data of the second memory array 120, accessing protected addresses will also access the associated Hamming code data. Direct writing of Hamming code addresses is allowed. Direct reading of Hamming code addresses is not allowed. Reading of Hamming code addresses is in conjunction with reading of protected data. Access to unprotected addresses will not enable the Hamming code access. Here, the Hamming code storage area has a capacity of 16 k by 4-bits of the total memory.

In one embodiment, both the Hamming code and the second write enable 170 signal are generated external to system 100. In addition, checking of the Hamming code is performed externally.

Memory Mapping

Figure 2:
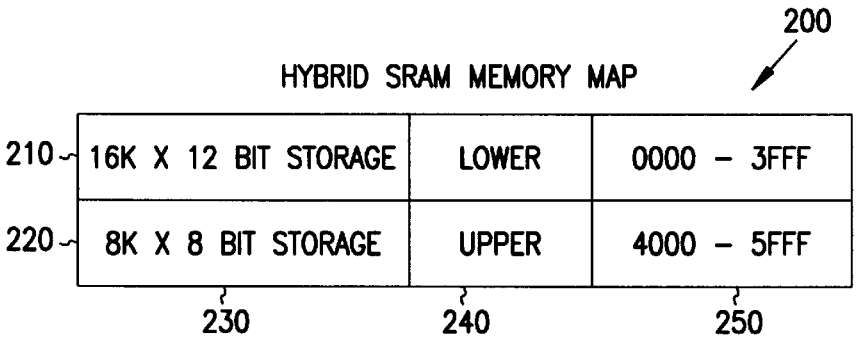
FIG. 2 is a memory map depicting addresses for one embodiment.

FIG. 2 depicts the memory map 200 for system 100. Memory map 200 is vertically divided into lower memory 210 and upper memory 220. Horizontally, memory map 200 depicts a first column 230 showing memory storage capacity, a second column 240 showing the memory range, and a third column 250 showing SRAM address.

Lower memory 210 has storage capacity of 16 k by 12-bits and provides protected storage. Protected storage includes 8-bits of data and 4-bits of Hamming code, for a total of 12-bits of data. Data in protected storage might include mission-critical data. As previously noted, both second memory array 120 and third memory array 130 have capacity of 16 k of data. Upper memory 220 has storage capacity of 8 k by 8-bits and provides unprotected storage. Unprotected storage is provided by first memory array 110.

System 100 provides 24 k of memory addressing in which 16 k is protected and 8 k is unprotected. Ranges of internal SRAM addresses, also encoded in hexadecimal, are denoted in column 250.

Physical Layout

The physical layout of system 100 incorporates shared resources. As previously noted, system 100 advantageously incorporates a variety of shared resources. In addition, system 100 is architectured in a way that improves physical isolation among elements.

Figure 3:
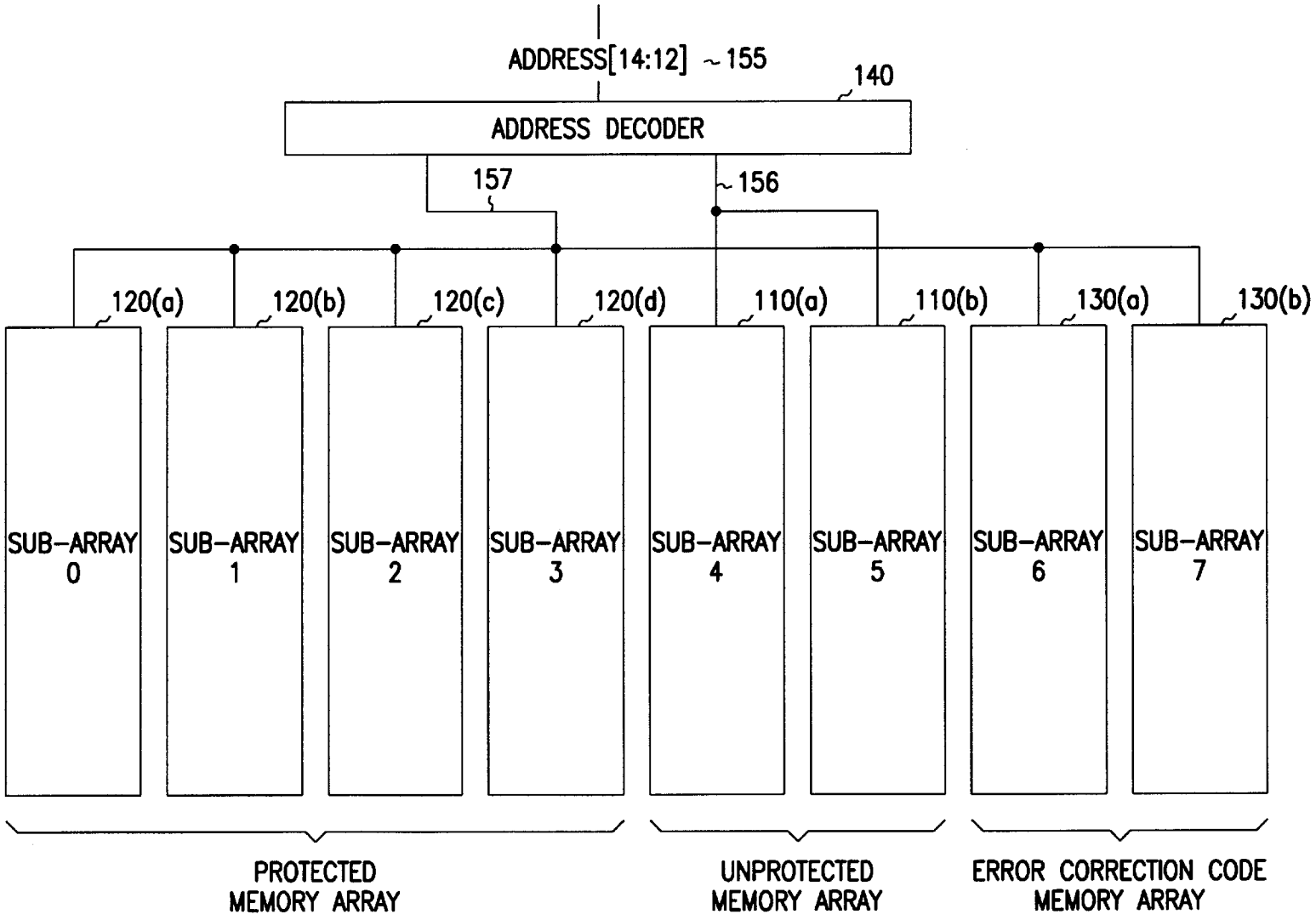
FIG. 3 is a block diagram showing one embodiment for the layout of sub-arrays.

Referring to FIG. 3, a portion of system 100 is depicted. As described earlier, address decoder 140 receives address information on bus 155. Address decoder 140 provides addressing information to the unprotected memory array via bus 156. In FIG. 3, the unprotected memory array is depicted as two memory sub-arrays, denoted 110(*a*) and 110(*b*). Address decoder 140 also provides addressing information to the protected memory array and the error correction code memory array via bus 157. In FIG. 3, the protected memory array is depicted as four sub-arrays, denoted 120(*a*), 120(*b*), 120(*c*) and 120(*d*). In FIG. 3, the error correction code memory array is depicted as two sub-arrays, denoted 130(*a*) and 130(*b*).

The shared resources reduce development costs, and reduce silicon area requirements. Address decoder 140 is one such shared resource. As previously discussed, address decoder 140 provides the addressing information to both the protected and unprotected memory arrays.

Both the input data path and the output data path also incorporate shared resources not shown in FIG. 3. Shared resources of the input data path includes data repeater logic, data buffers and interconnect routing. The output path includes shared tristate output busses, output multiplexers, and interconnect routing. In addition, the device incorporates a single power supply. Traditional SRAMs require independent control and support circuitry for each of the aforementioned resources.

As depicted in FIG. 3, the protected memory array and the error correction code memory array are physically separated by the unprotected memory array. This configuration provides advantageous isolation for protected data. In other words, events occurring at the protected memory array are remote from, and unlikely to impair the performance of, the error correction code memory array.

System 100 is fabricated using American Microsystems, Inc., (Pocatello, Id., U.S.A.) silicon wafers using hybrid technology process L5. American Microsystems, Inc. provides manufacturing processes for application specific integrated circuits and hybrid technologies.

We claim:

1. A hybrid computer memory comprising:

a silicon surface;

a first memory array on the surface, having a capacity of 8 k by 8-bits and including:
a first write enable connection;
a first input port having eight data connections; and
a first output port having eight data connections; and the first memory array is operatively coupled to an address decoder; and a second memory array on the surface, having a capacity of 16 k by 8-bits and
operatively coupled to all of the following:

the first write enable connection;
the first input port;
the first output port; and
the address decoder; and a third memory array on the surface, having a capacity of 16 k by 4-bits and comprising:
a second write enable connection;
a second input port having four data connections; and
a second output port having four data connections; and the third memory array is operatively coupled to the address decoder and stores error correction code data.

* * * * *